(12) United States Patent
Allibert et al.

(10) Patent No.: US 7,790,048 B2
(45) Date of Patent: Sep. 7, 2010

(54) TREATMENT OF THE WORKING LAYER OF A MULTILAYER STRUCTURE

(75) Inventors: Frédéric Allibert, Grenoble (FR); François Brunier, Grenoble (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 725 days.

(21) Appl. No.: 11/433,713

(22) Filed: May 12, 2006

(65) Prior Publication Data

US 2006/0201907 A1    Sep. 14, 2006

Related U.S. Application Data

(63) Continuation of application No. PCT/IB2005/000832, filed on Mar. 10, 2005.

(30) Foreign Application Priority Data

Mar. 10, 2004  (FR) .................................. 04-02473

(51) Int. Cl.
*B44C 1/22*    (2006.01)
*C23F 1/00*    (2006.01)
(52) U.S. Cl. ............................. 216/41; 216/13; 216/83; 438/745; 156/345.11
(58) Field of Classification Search ............... 216/13, 216/41, 83; 438/745; 156/345.11
See application file for complete search history.

(56) References Cited

U.S. PATENT DOCUMENTS

| 2,905,539 | A | * | 9/1959 | Bowerman | ................... | 174/250 |
| 4,668,083 | A | | 5/1987 | Akkapeddi et al. | .......... | 355/100 |
| 5,433,821 | A | * | 7/1995 | Miller et al. | ................... | 216/18 |
| 5,519,336 | A | | 5/1996 | Liu et al. | ..................... | 324/769 |
| 5,786,231 | A | | 7/1998 | Warren et al. | ................. | 438/17 |
| 6,159,829 | A | | 12/2000 | Warren et al. | ............... | 438/530 |

(Continued)

FOREIGN PATENT DOCUMENTS

AT    408158    9/2001

(Continued)

OTHER PUBLICATIONS

S. Cristoloveanu et al., XP-000928623, "A Review of the Pseudo-MOS Transistor in SOI Wafers: Operation, Parameter Extraction, and Applications", IEEE Transactions on Electron Devices, vol. 47, No. 5, pp. 1018-1027 (May 2000).

(Continued)

*Primary Examiner*—Shamim Ahmed
(74) *Attorney, Agent, or Firm*—Winston & Strawn LLP

(57) ABSTRACT

The invention relates to a method for forming a plurality of electrically conductive islands in a working layer of a multilayer structure made from semiconductor materials, with the structure including an electrically insulating layer located beneath the working layer. This method includes the steps of selectively masking certain regions of the working layer in order to define several islands therein, with each region masked from the working layer corresponding to a respective island, and then wet chemical etching of the masked working layer to form a plurality of working layer islands each surrounded by the electrically insulating layer. The invention also proposes the application of such a method to the characterization of the electrical properties of a structure, and an associated device.

16 Claims, 3 Drawing Sheets

U.S. PATENT DOCUMENTS

Figure 1:
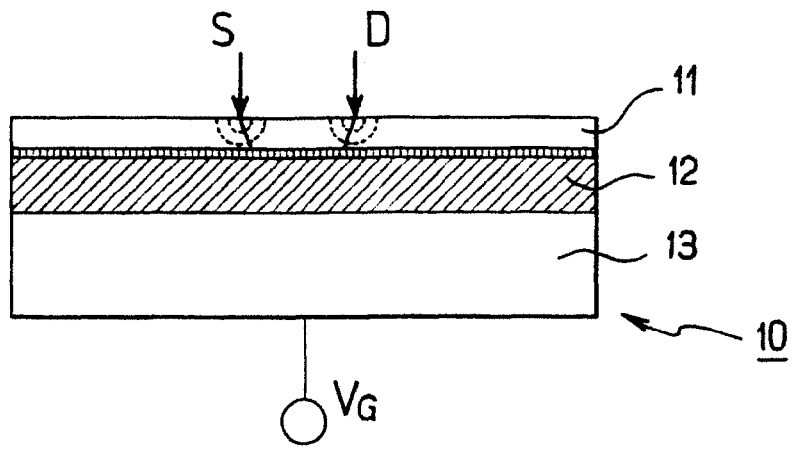

| | | | |
|---|---|---|---|
| 6,191,007 B1* | 2/2001 | Matsui et al. | 438/459 |
| 6,300,649 B1* | 10/2001 | Hu et al. | 257/69 |
| 2003/0104287 A1* | 6/2003 | Yuasa | 430/5 |

FOREIGN PATENT DOCUMENTS

| | | |
|---|---|---|
| FR | 2 867 606 A1 | 9/2005 |
| JP | 56123376 | 9/1981 |
| JP | 59048945 | 3/1984 |

OTHER PUBLICATIONS

S. Cristoloveanu et al., XP-000246200, "Point-Contact Pseudo-MOSFET for *In-Situ* Characterization of As-Grown Silicon-on Insulator Wafers", 8179 IEEE Transactions on Electron Devices, vol. 13, No. 2, pp. 102-104 (Feb. 1992).

S. Cristoloveanu et al., XP-000928623, "A Review of the Pseudo-MOS Transistor in SOI Wafers: Operation, Parameter Extraction, and Applictions", IEEE Transactions on Electron Devices, vol. 47, No. 5, pp. 1018-1027 (2000).

S. Cristoloveanu et al., XP-000246200, "Point-Contact Pseudo-MOSFET for *In-Situ* Characterization of As-Grown Silicon-on Insulator Wafers", IEEE Electron Device Letters, vol. 13, No. 2, pp. 102-104 (1992).

\* cited by examiner

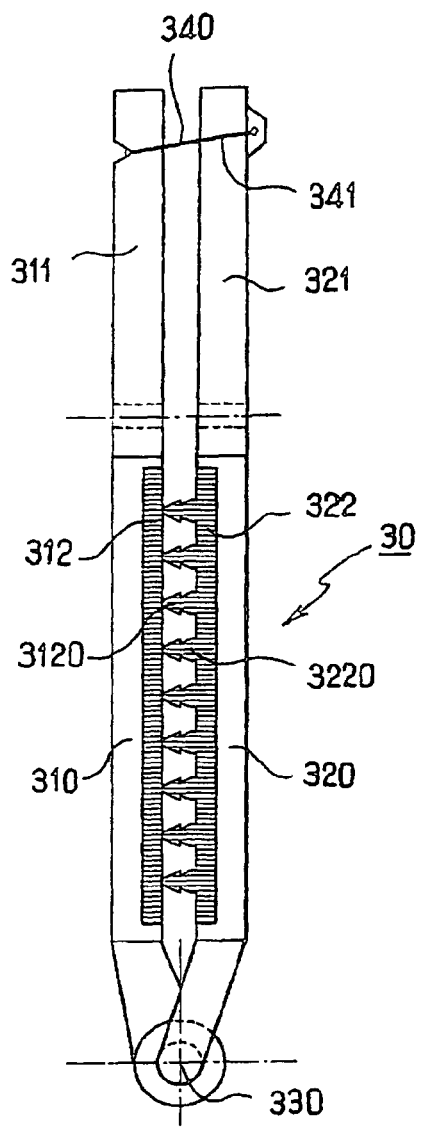
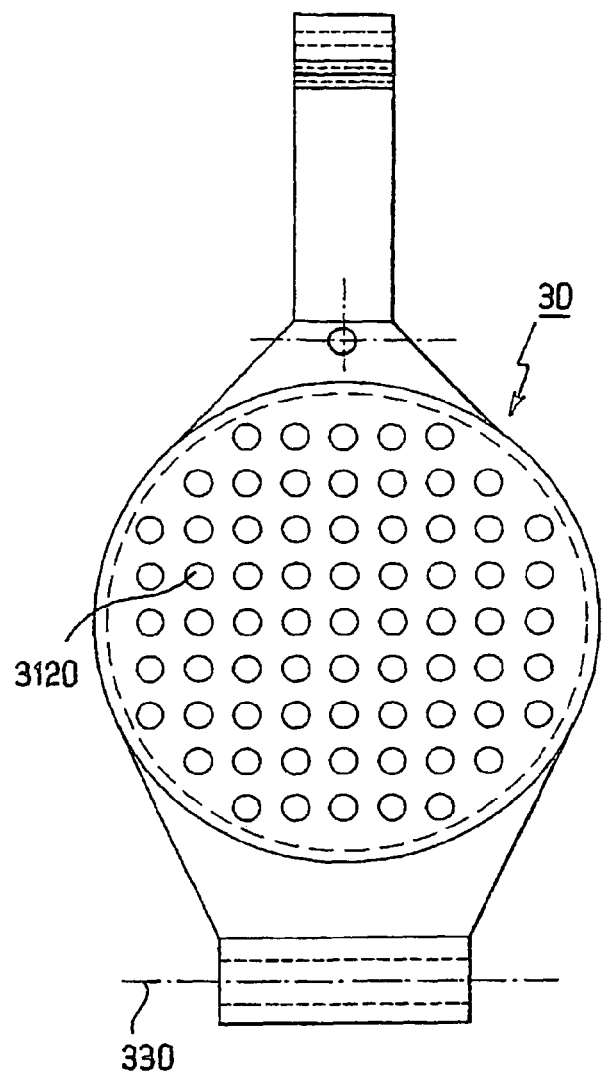
FIG.4a  FIG.4b
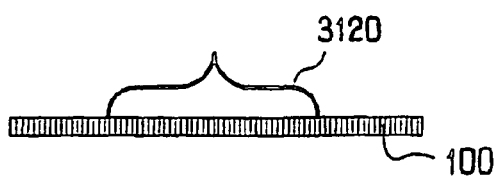
FIG.4c

TREATMENT OF THE WORKING LAYER OF A MULTILAYER STRUCTURE

CROSS-REFERENCE TO RELATED APPLICATION

This application is a continuation of International Application PCT/IB2005/000832 filed Mar. 10, 2005, the entire content of which is expressly incorporated herein by reference.

BACKGROUND

This invention relates in general to the treatment of various structures made from semiconductor materials for applications in microelectronics, optics and optoelectronics. Generally, these structures are multilayer structures including a so-called "working" electrically conductive layer and an electrically insulating layer. The working layer usually is a superficial layer while the electrically insulating layer is buried in the thickness of the structure. Typical structures can for example include Silicon On Insulator (SOI) structures. In this case, the working layer is the superficial thin layer of silicon and the buried insulating layer is usually an oxide. Of course, the skilled artisan is aware of other SOI and multilayer structures that are commonly used in this art.

Methods for treating an electrically conductive working layer of a multilayer structure made from semiconductor materials of the type mentioned herein are already known. Such methods make it possible to constitute islands of electrically conductive material in the working layer of a structure (e.g., silicon in the case of an SOI). It is indeed necessary to constitute such islands in order to realize certain operations on the structures relating to the invention. These operations comprise in particular the characterization of the electrical properties of the structure. Such characterization can in particular be performed by implementing at least one pseudo-component of the structure, and this is generally referred to as pseudo-MOSFET.

The pseudo-MOSFET is a macroscopic device similar to a transistor, much which requires for its manufacture a very limited number of technological steps. Such a device can in particular be constituted in a structure such as that mentioned above. This device further presents the advantage of providing results that are characteristic of the material of the working layer in which it is manufactured, without requiring modifications that are inherent to the CMOS manufacturing method (channel layout, etc.). It is therefore simple to constitute in a structure (SOI or other) such a device, in order to characterize the electrical properties of this structure and in particular of its working layer.

A pseudo-MOSFET incorporated into an SOI uses the intrinsic MOS structure of the SOI, by using the buried oxide as a dielectric gate, the substrate as a gate, and two contacts on the working layer as source and drain. It has the form of a MOSFET, but inversed. It is based on a simple MOSFET using contacts of the Schottky type. Such a pseudo-MOSFET is shown schematically in FIG. 1 which illustrates the case of an SOI 10 comprising a thin working layer of silicon 11, an insulating layer 12 and a substrate layer 13. A pseudo-MOSFET was constituted in the SOI, in a determined region of the latter. This pseudo-MOSFET comprises two contacts S and D in the working layer 11, for the source and drain of the device respectively. Substrate layer 13 serves as a gate for it (contact Vs).

The pseudo-MOSFET thus constitutes an advantageous device for the characterization of semiconductor structures. It is manufactured by spatially defining a given pattern in the upper layer of this type of structure. This pattern is thus electrically isolated from the substrate layer 13 of the structure, thanks to the insulating layer 12. It can be implemented according to the so-called "T-MOS Test" method of characterization. The "v-MOS Test" method makes it possible to realize on the front side of the structure (i. e. the side that bears the working layer of the structure) two contacts via pressure of two tungsten carbide points. These two contacts—which correspond to contacts S and D in FIG. 1—are applied to the center of the pattern defined in the upper layer of the structure.

The structure thus constitutes a characterization sample (the terms "structure" and "sample" shall be used indifferently in the remainder of this text). The rear side of the structure rests on a conductor plate on which is applied voltage. This contact on the rear side of the structure corresponds to the gate contact.

Figure 2:
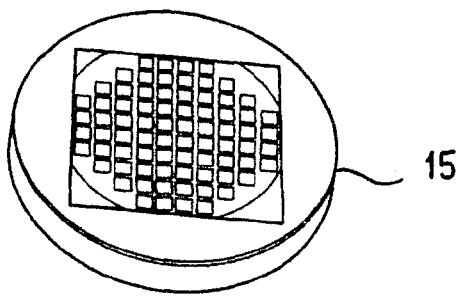

Within the framework of the "T-MOS Test" method, several isolated islands are realized one after the other in the structure to be qualified, such as shown in FIG. 2. Each one of these islands 15 is separated from the other islands by trenches along which the material of the working superficial layer has been removed, in such a way that the insulating layer is flush in these trenches. And the characterization of the structure according to this method is in general accomplished by characterizing the various islands 15 of the structure, by applying the discreet contacts mentioned above.

It is thus possible to realize a mapping of the electrical properties of the structure, in its different islands. Note that the characterized electrical parameters are typically the following: ue (electron mobility), ph (hole mobility), Dit (interface state density), Vth (threshold voltage), VFB (flat band voltage), Qbox (charge of the insulating layer). This method of characterization thus makes it possible to perform in a synoptic manner a mapping characterizing different islands of a same structure, which is advantageous.

In order to manufacture islands such as those shown in FIG. 2, a lithography method is implemented. This type of method makes it possible to constitute several islands, even on structures of small size (with a diameter of 3 inches, for example). But such a procedure is cumbersome to implement, and costly. Furthermore, this type of method does not in general make it possible to constitute islands over the entire surface of a structure of significant size (e. g. case with diameters of 8 inches, or even more).

In a variant of the manufacture of islands by lithography, it is possible to manufacture on a sample structure an island of characterization by etching the structure selectively through a "hard" masking. In this variant, a selective attack of the structure by wet etching is generally implemented, in order to constitute the island.

Figure 3:
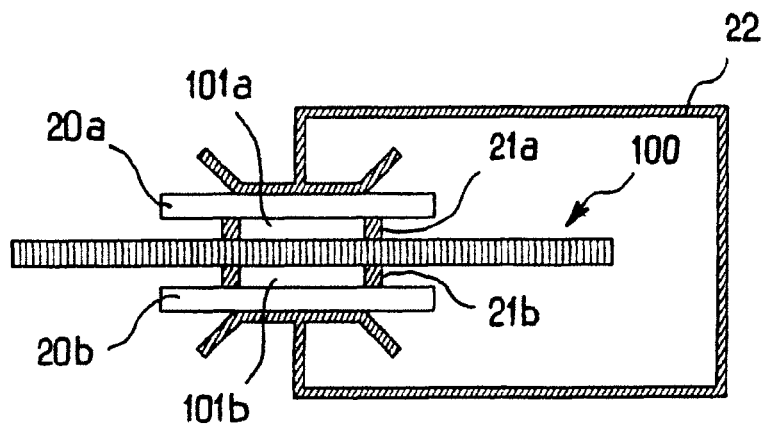

FIG. 3 thus shows a sample structure 100 related to the invention. Two 0-rings 21a, 21b are each pressed against a respective glass plate 20a, 20b and one of the sides of the sample structure. This pressure is provided by means 22. The two 0-rings thus define across from the two sides of the sample structure 100 two regions 101a, 101b of the sample which are isolated in a sealed manner.

Sample 100 with its isolated regions is then exposed to an etching solution capable of selectively etching the working layer of the sample-for example KOH in the case of a silicon working layer sample. By "selectively" etching the working layer is meant that only the working layer is etched, and that the adjacent layers are not etched. This results in wet etching of the working layer, except across from regions 101a and 101b in which the layers of the original structure are preserved. These regions correspond to an island at the level of which the sample shall be able to be characterized in the same manner as disclosed above concerning the "T-MOS Test" method.

In this way, a sample is manufactured having a single island. And the manufacturing method for this island, which implements wet etching, is not exposed to the inconveniences mentioned above concerning the method of constituting islands by lithography. This type of method by wet etching is therefore advantageous. But this type of method however only makes it possible to constitute a single island on a sample structure. It therefore does not make it possible to constitute several islands on the surface of the structure, in order to realize a mapping such as that mentioned above. Thus, this prior art technique need improvement.

SUMMARY OF THE INVENTION

The invention now makes it possible to constitute several islands on the same structure, without exposure to the inconveniences mentioned above concerning methods via lithography. More precisely, the invention relates to a method for forming a plurality of electrically conductive islands in a working layer of a multilayer structure made from semiconductor materials, with the structure including an electrically insulating layer located beneath the working layer. This method comprises selectively masking certain regions of the working layer in order to define several islands therein, with each region masked from the working layer corresponding to a respective island, and then wet chemical etching of the masked working layer to form a plurality of working layer islands each surrounded by the electrically insulating layer.

The invention also relates to the application of such method to the characterization of the electrical properties of a multilayer structure made from semiconductor materials and to a device that can be implemented within the framework of such method. The multilayer structure that is produced with such islands represents yet another embodiment of the invention.

BRIEF DESCRIPTION OF THE DRAWING FIGURES

Figure 5A:
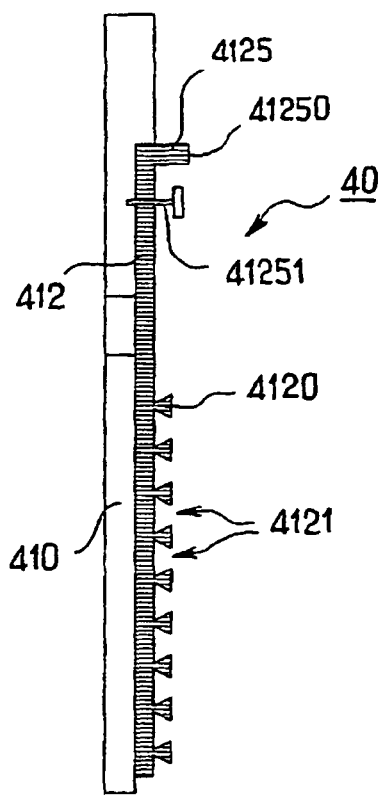
Figure 5B:
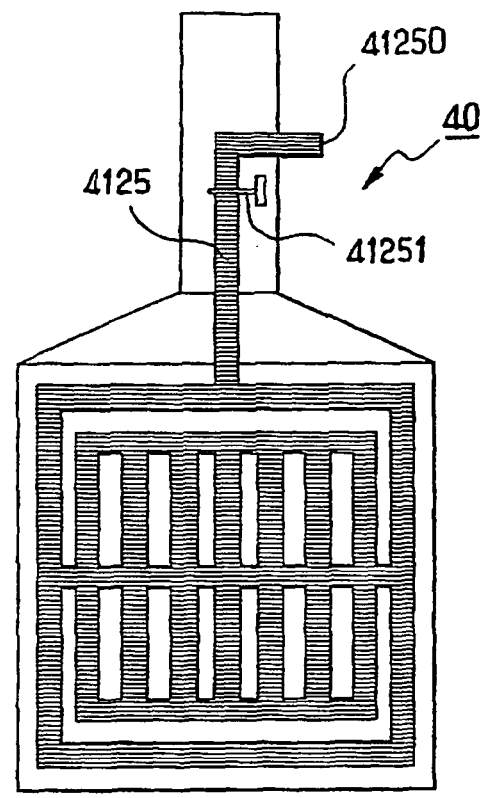
Figure 5C:
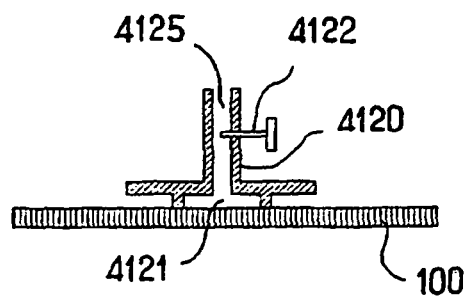

Other features and advantages of the invention shall become apparent in the following description, when read in combination with the appended drawings, wherein:

FIG. 1 schematically illustrates a conventional pseudo-MOSFET according to the prior art;

FIG. 2 illustrates several isolated islands that are realized within the framework of a conventional "T-MOS Test" method, FIG. 3 shows a sample conventional structure 100 that is related to the invention, FIGS. 4a and 4b are respectively a side view and a front view of a device according to a first embodiment of the invention, FIG. 4c is a schematic representation of an elementary mask implemented in the device in FIGS. 4a and 4b, FIGS. 5a and 5b are respectively a side view and a front view of a device according to a second embodiment of the invention, and FIG. 5c is a schematic representation of an elementary mask implemented in the device in FIGS. 5a and 5b.

DETAILED DESCRIPTION OF THE PREFERRED EMBODIMENTS

In a first preferred embodiment, the invention relates to a method for treating a working electrically conductive layer of a multilayer structure made from semiconductor materials. This structure includes an electrically insulating layer under the working layer. This treatment is designed to constitute in the working layer at least one island surrounded by the material of the electrically insulating layer, and it includes a step of wet chemical etching of the working layer. The method includes a selective masking of several regions of the working layer prior to the wet etching step in order to constitute several islands in this working layer, where each region masked from the working layer corresponds to a respective island.

Preferred, but not restrictive, aspects of this treatment method are the following:

the wet etching step is realized simultaneously for the entire structure, said masked regions being protected from etching.

The method implements a number of preferred steps. Generally, a sealed masking is applied to each region of the structure corresponding to an island, by respective elementary masks. Thereafter, the exposed islands are subjected to wet etching with an etching solution that selectively attacks the working layer, but not the electrically insulating layer or the elementary masks. Thereafter, the etched structure is subjected to rinsing and drying.

The sealed masking is obtained by tightening of a device having the general form of a clamp and equipped with elementary masks on the structure. The masking of each region is realized by applying an elastic masking of the suction cup type on each region. Alternatively, the masking of each region is realized by applying on the region a rigid mask associated with means of depression of the rigid mask. In a preferred embodiment, the working layer is made of silicon and the structure is an SOI.

The invention proposes according to a second aspect an application of such method to the characterization of the electrical properties of a multilayer structure made from semiconductor materials. Such an application can include the mapping of the electrical properties of the regions determined covering practically the entire surface of the working layer of the structure.

Finally, the invention proposes according to a third aspect a system for treating a working electrically conductive layer of a multilayer structure made from semiconductor materials. This structure includes an electrically insulating layer under the working layer. The treatment is designed to constitute at least one island in the working layer, with the island surrounded by the material of the electrically insulating layer. This system includes a device having several elementary masks in order to mask in a sealed manner the respective regions of the working layer so as to realize wet etching of the structure once the regions have been masked.

Preferred, but not restrictive, aspects of such device include that the elementary masks include rigid masks associated with means of depression. Alternatively, the elementary masks can include elastic masks of the suction cup type. The device can also include a pad bearing either or both of these masks. Preferably, the device has the general configuration in the form of a clamp with two jaws of which a first jaw bears the masks in such a way that when the clamp tightens on the structure, the masks make a sealed contact with the structure. The second jaw of the device can bear spurs in order to ensure that the rear side of the opposed structure is maintained against the side of the structure bearing the working layer when the clamp is tightened on the structure.

With reference to FIGS. 4a and 4b, a device is shown for treating a multilayer structure comprised of a superficial electrically conductive working layer, and a buried electrically insulating layer. This structure can be an SOI, for example.

Such a structure can be treated by a device according to a first embodiment of the invention (corresponding to FIGS. 4a and 4c) or by a device according to a second embodiment of the invention (corresponding to FIGS. 5a and 5c). The structure is not shown in these figures, for reasons of clarity, although the area destined to receive this structure is nevertheless shown via a dotted line in FIG. 4b.

Device 30 in FIGS. 4a and 4b has a general configuration in the form of a clamp with two jaws. FIG. 4a thus shows a first jaw 310, and a second jaw 320. The two jaws are articulated around axis 330, and can be closed and opened by pivoting around this axis. In the part of the device opposed to this axis 330, device 30 has a handle 311, 321 in association with each respective jaw 310, 320.

Device 30 can thus be opened or closed by hand, by an operator. Note however that it is possible as a variant to provide that these operations be realized by a machine acting on the two handles 311, 321. A closing lock 340 of the device may also be provided at the level of these two handles. This lock serves to maintain the device in closed position, when the structure has been placed inside the device. The lock 340 can for example include a tightening screw 341 for the two handles.

Note on the sides across from jaws 310 and 320, at the level of the part of the device that is to receive the structure, lining pads 312, 322 that are respectively associated with the two sides across from these jaws. Each one of these pads is attached by any means known per se to its associated jaw side (for example by forced insertion, gluing or any other means, etc.). The pads have a generally circular shape, in order to receive a region corresponding to the shape of the structures that shall be treated by the device.

Note that this device can include fool-proof devices or guide marks in order to ensure correct positioning of a structure placed in the device. In particular, a snug (not shown) can be provided destined to work with a notch which is generally found at the periphery of the structures relating to the invention. It is also possible to provide various guide marks in order to position structures of different sizes (for example disks of various diameters). These guide marks can in particular be provided on one and/or the other of the two pads.

The pad 312 carries several elastic suction cups 3120, of the same material as the rest of the pad. As a variant, it is also possible to provide that these suction cups be attached in a removable manner on the pad in predetermined places. One can for example provide to constitute in the pad means for receiving such removable suction cups (for example in the form of threading designed to receive the screw of a suction cup). Each suction cup is-designed to form a sealed contact with the surface of the structure, when the latter has been positioned in the device and the device has been closed around it. In this respect, note that the structure is placed in the device in such a way that the working layer of this structure is across from the suction cups.

It is possible according to a variant to provide that the second pad 322 be equipped with protruding spurs in order to maintain the wafer and the structure when the latter is in position in the closed device. FIG. 4a thus shows a series of protruding spurs 3220. FIG. 4a shows that a spur is across from each suction cup.

It is however possible in this variant to adapt the number and layout of the spurs. In any case, this number and layout must make it possible to apply enough pressure on this structure when the device is closed on the structure to be treated in order to guarantee that the contact is sealed between the working side of the structure and suction cups 3120. This pressure must also remain distributed and limited enough in order to avoid damage to the structure. Naturally, even distribution of the spurs and suction cups on the surface of the respective pads 312, 322 is preferred.

FIG. 4c shows in a schematic manner a suction cup 3120, in contact with the structure 100 to be treated. Device 30 can also include several suction cups 3120, in which each one masks in a sealed manner the respective regions of the working layer of the structure 100. It is therefore possible to realize wet etching of the structure, once said regions have been masked, without the etching solution attacking such regions.

In practice, device 30 containing a structure is plunged into an etching solution, or the structure placed in the device is soaked by any manner known per se with this solution. In the case of a structure whose working layer is of silicon, the etching solution can be KOH. In any case, the etching solution is selected so as to etch only the material of the working layer. The material of the various constituents of device 30 must be adapted in order to not be attacked by the etching solution. One can for example provide that pads 312, 322 and their suction cups and spurs are made of rubber that is not attacked by the etching solution. The invention makes it possible to constitute in this way islands that correspond to the regions of the working layer of the structure that have been preserved from etching by the masking of the suction cups.

The islands have typically a round shape for avoiding edge effects (this being illustrated in particular in FIG. 4b). And these islands have typically a diameter of at least 1 cm. A round shape and such a diameter are indeed well adapted for the application to a T-MOUS Test. And in the case of the invention, one benefits from the advantages of a lithographic method (in particular the possibility of constituting several island simultaneously) without being subject to its cumbersomeness, and furthermore a reduced cost price.

Implementation of the invention thus provides a number of advantages. The selective masking of several regions of the working layer of the structure to be treated, in order to constitute in this working layer several islands, is realized with each region masked from the working layer corresponding to a respective island. The wet etching step then can be conducted to constitute the islands, and it can be conducted simultaneously upon the entire structure. After the wet etching, conventional rinsing and drying steps are conducted on the structure (for example via nitrogen blowing).

Sealed masking of the regions of the working layer of the structure is thus obtained by tightening a device in the general form of a clamp equipped with elementary masks on said structure. This type device can be of the type shown in FIGS. 4a and 4b. It can according to another embodiment of the invention be as device 40 in FIGS. 5a and 5b. In this embodiment of the invention, the device for treating the structure is comprised of a single jaw 410. And the elementary masks that were realized in the form of elastic suction cups 3120 (FIGS. 4a and 4c) are here realized by rigid means 4120 associated with means of depression.

Means 4120 define among themselves a network of cavities 4121, and these cavities communicated with a source of depression (such as a vacuum). These means 4120 constitute elementary masks for the realization of islands, with each cavity 4121 allowing a respective island to be defined on the structure. Means 4120 can in particular be realized in the form of seals.

Contrary to device 30 in FIGS. 4a and 4b, the device 40 can only have one jaw 410. This single jaw may be linked to the vacuum via a network. The plate is directly placed on means 4120. It is maintained on these means thanks to the vacuum, in view of its immersion in the etching solution. And except for specific elements relating to a second jaw, as well as elementary masks realized in the form of suction cups, all of the comments made above concerning device 30 also apply to device 40.

One can thus provide for fool-proof devices and/or guide marks of the structure, including for structures for different sizes. And the general method for implementing device 40 is the same as for device 30, except for the forming of the sealed contact of the regions of the structure on which islands are to be constituted with the corresponding positions of the treatment device.

Means 4120 can be constituted by a single part 412, itself borne by jaw 410. This part 412 can be a rigid part, or have a certain degree of elasticity, in particular at the level of means 4120, in order to guarantee a sealed contact with the structure. Part 412 can be attached to jaw 410 by any manner known per se.

The schematic structure of elementary mask 4120 is shown in FIG. 5c. Each elementary mask defines a cavity 4121 when it is placed into contact with the structure 100, and maintained in contact with the structure following the application of a depression at the level of the cavity. It thus provides means for establishing a depression or a controlled vacuum inside the cavity 4121, once contact between the elementary mask and the structure is established.

These means can include a general depression circuit 4125, that can be connected with a depression source via connector 41250. Valve 41251 thus makes it possible to selectively establish a depression in this circuit 4125. And it is also possible to provide in association with each elementary mask an individual valve, as shown in FIG. 5c (valve 4122).

The invention thus makes it possible to realize several islands in the working layer of a same structure to be characterized, via a wet etching method that is simple and advantageous. It is furthermore possible to treat in this way different structure sizes. Further note that the implementation of the invention is further simplified due to the fact that pads 312, 322 as well as part 422 can be attached in a removable manner to their respective clamp jaws, for removal and cleaning after wet chemical etching.

The invention can be implemented advantageously in order to realize a mapping of the electrical properties of determined regions of the working layer of a structure relating to the invention. And as we have seen, these determined regions cover practically the entire surface of the working layer of the structure to be characterized. It shall be noted that the invention differs from known techniques which include the creation of at least one island at the surface of a multilayer structure. In this respect two prior art techniques are briefly exposed and discussed below.

One known technique is disclosed in U.S. Pat. No. 6,159,829. In this document, the top Si layer of a structure is etched through a mask by a mixing of $HNO_3$, $CH_3COOH$ and HF. Such etching (with HF alone, for example) etches not only the top layer of the structure, but also the layer underneath. In the case of the invention, on the contrary, only the top layer (i.e., the working layer) is etched-in particular because the etching is carried out with an etching solution which etches only the working layer (e.g., KOH for a working layer in Si). It shall furthermore be noted that in the case of U.S. Pat. No. 6,159,829, the masking must be made from resin which sticks to the surface of the structure. In the case of the present invention, the masking is obtained by replaceable and reusable means, and this makes the invention particularly simple and efficient.

Finally, the article "A Review of the Pseudo-MOS Transistor in SOI Wafers: Operation, Parameters Extraction, and Applications" (IEEE Transactions on Electron Devices, Vol. 47, n° 5, May, 2000), also provides indications on some type of etching. But this article does not provide details on the type of technique used. In particular, it does not mention in any manner a selective etching. It shall furthermore be noted that this article teaches only (as illustrated in FIG. 1 of this article) creating a single Si island, whereas the application of the invention to a T-MOUS Test needs several islands. In contrast, such multiple islands are easily provided by the present invention.

What is claimed is:

1. A method to facilitate mapping of electronic properties of a multilayer structure made from semiconductor materials, with the structure including a working layer and an electrically insulating layer located beneath the working layer, wherein the method comprises:
    applying a plurality of elementary masks onto the working layer in a sealed manner to selectively mask desired regions of the working layer in order to define boundaries of several islands therein with the elementary masks providing a cavity within each boundary to minimize contact of the masks with the islands, with each region masked from the working layer corresponding to a respective island;
    wet chemical etching of the masked working layer to etch away unmasked portions of the working layer, and
    removing the elementary masks to form a plurality of working layer islands each surrounded by the electrically insulating layer.

2. The method of claim 1, wherein the entire structure is simultaneously subjected to the wet etching with the masked regions being protected from the etching.

3. The method of claim 1, wherein after etching the structure is subjected to rinsing and drying.

4. The method of claim 3, wherein the sealed masking is obtained by tightening a device in the general form of a clamp and equipped with the elementary masks onto the structure.

5. The method of claim 3, wherein the masking of each region is realized by providing the elementary masks in the form of an elastic mask of a suction cup type which is applied onto the working layer.

6. The method of claim 3, wherein the masking of each region is realized by providing the elementary masks in the form of a rigid mask which is applied onto the structure, wherein the rigid mask is associated with means of depression.

7. The method of claim 1, wherein the working layer is made of silicon.

8. The method of claim 7, wherein the structure is an SOI.

9. The method of claim 1, which further comprises mapping the electronic properties of the multilayer structure by measuring the electronic properties of the islands.

10. The method of claim 1, wherein the islands cover practically the entire surface of the working layer of the structure.

11. The method of claim 1, wherein the elementary masks include rigid masks associated with means of depression.

12. The method of claim 1, wherein the elementary masks include elastic masks of the suction cup type.

13. The method of claim 1, wherein the masks are applied by a pad bearing the masks.

14. The method of claim 13, wherein the pad is applied by way of a device that has a general configuration in the form of a clamp with two jaws of which a first jaw bears the masks in such a way that when the clamp is tightened.

15. The method of claim 14, wherein the second jaw of the device bears spurs in order to ensure that the rear side of the opposed structure is maintained against the side of the structure bearing the working layer when the clamp is tightened on the structure.

16. The method of claim 1, wherein the masking of each region is realized by providing the elementary masks in the form of an elastic mask of a suction cup type which is applied onto the working layer.

* * * * *